US008470141B1

(12) United States Patent
Bernick

(10) Patent No.: US 8,470,141 B1
(45) Date of Patent: Jun. 25, 2013

(54) HIGH POWER CATHODE

(75) Inventor: Mark A. Bernick, White Oak, PA (US)

(73) Assignee: Angstrom Sciences, Inc., Dusquesne, PA (US)

( * ) Notice: Subject to any disclaimer, the term of this patent is extended or adjusted under 35 U.S.C. 154(b) by 812 days.

(21) Appl. No.: 11/411,427

(22) Filed: Apr. 26, 2006

Related U.S. Application Data

(60) Provisional application No. 60/676,231, filed on Apr. 29, 2005.

(51) Int. Cl.
C23C 14/35 (2006.01)
(52) U.S. Cl.
USPC ............ 204/192.12; 204/298.09; 204/298.14; 204/298.16
(58) Field of Classification Search
None
See application file for complete search history.

(56) References Cited

U.S. PATENT DOCUMENTS

| | | | | |
|---|---|---|---|---|
| 4,123,686 A | * | 10/1978 | Keller et al. | 313/230 |
| 4,444,643 A | * | 4/1984 | Garrett | 204/298.2 |
| 4,564,435 A | * | 1/1986 | Wickersham | 204/298 |
| 4,668,365 A | * | 5/1987 | Foster et al. | 204/192.23 |
| 4,865,708 A | * | 9/1989 | Welty | 204/192.12 |
| 5,262,028 A | * | 11/1993 | Manley | 204/192.12 |
| 5,330,632 A | * | 7/1994 | Sichmann | 204/298.18 |
| 5,407,551 A | * | 4/1995 | Sieck et al. | 204/298.19 |
| 5,656,141 A | * | 8/1997 | Betz et al. | 204/298.05 |
| 5,736,019 A | | 4/1998 | Bernick | |
| 6,171,461 B1 | | 1/2001 | Bernick | |
| 6,436,252 B1 | * | 8/2002 | Tzatzov et al. | 204/298.22 |

FOREIGN PATENT DOCUMENTS

WO  WO 03/015124 A1 * 2/2003

OTHER PUBLICATIONS

"contour." Merriam-Webster Online Dictionary. 2008. Merriam-Webster Online. Nov. 18, 2008 <http://www.merriam-webster.com/dictionary/contour>.*

* cited by examiner

Primary Examiner — Keith Hendricks
Assistant Examiner — Kourtney S Carlson
(74) Attorney, Agent, or Firm — The Webb Law Firm

(57) ABSTRACT

A magnetron sputtering electrode for use within a magnetron sputtering device that includes a cathode body, a target receiving area defined adjacent the cathode body, a plurality of magnets received within a magnet receiving chamber and an anode shield surrounding the cathode body. At least a portion of a coolant passageway is defined by the anode shield, whereby the coolant passageway is adapted to receive coolant to circulate therethrough thereby cooling the anode shield.

23 Claims, 3 Drawing Sheets

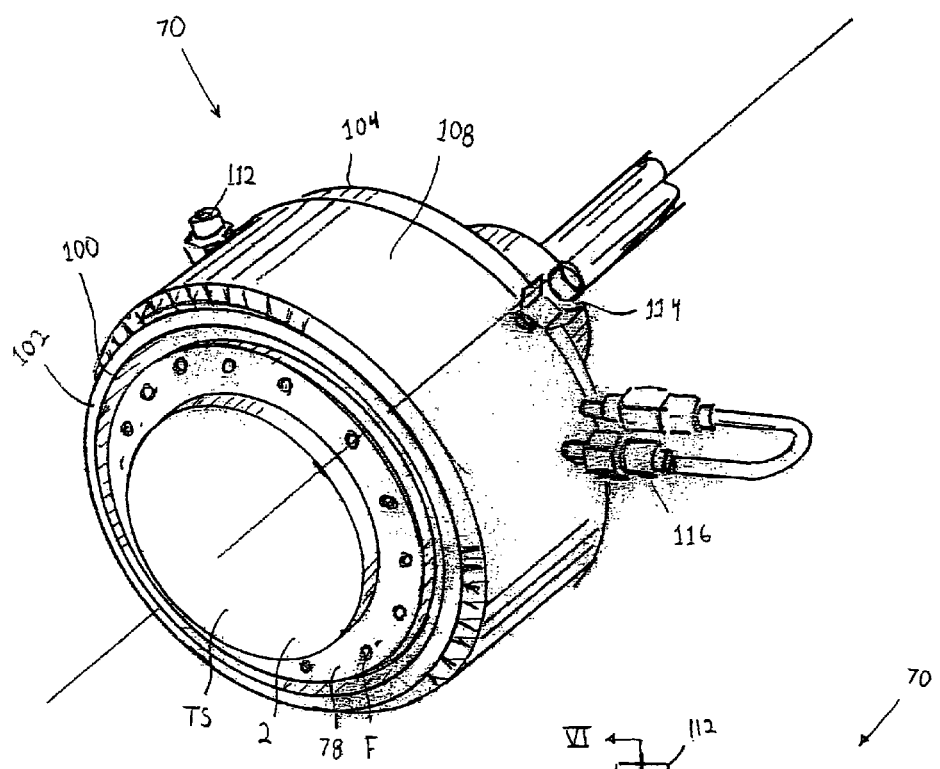
FIG. 3
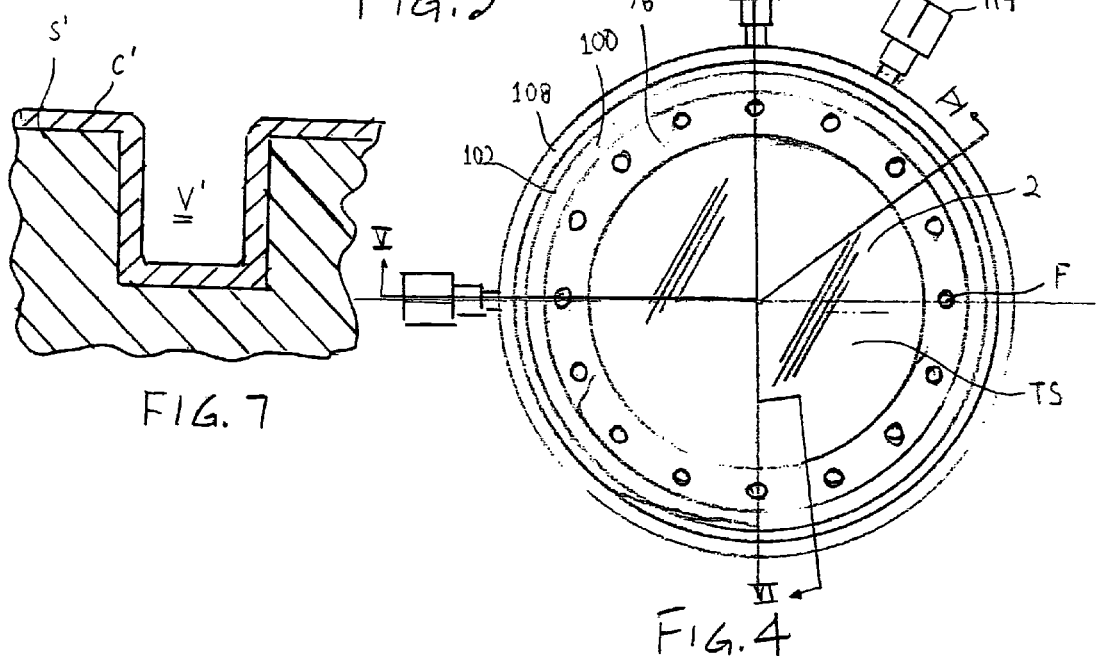
FIG. 7
FIG. 4

HIGH POWER CATHODE

CROSS REFERENCE TO RELATED APPLICATION

This application claims the benefit of U.S. Provisional Application No. 60/676,231 entitled "High Power Cathode," filed on Apr. 29, 2005, which is hereby incorporated by reference.

BACKGROUND OF THE INVENTION

1. Field of the Invention

The present invention relates to a magnetron sputtering apparatus and, more particularly, to a high power cathode, which provides better uniformity in the material deposited, particularly in the area of semi-conductor manufacturing.

2. Description of Related Art

A typical magnetron sputtering device includes a vacuum chamber having an electrode contained therein, wherein the electrode includes a cathode portion, an anode portion and a target. The term electrode is oftentimes referred to in the industry as a cathode. In operation, a vacuum is drawn in the vacuum chamber followed by the introduction of a process gas into the chamber. Electrical power supplied to the electrode produces an electronic discharge which ionizes the process gas and produces charged gaseous ions from the atoms of the process gas. The ions are accelerated and retained within a magnetic field formed over the target, and are propelled toward the surface of the target which is composed of the material sought to be deposited on a substrate. Upon striking the target, the ions dislodge target atoms from the target which are then deposited upon the substrate. By varying the composition of the target, a wide variety of substances can be deposited on various substrates. The result is the formation of an ultra-pure thin film deposition of target material on the substrate.

FIG. 1 is a sectional side view of a prior art magnetron sputtering electrode 1 that includes a target 2 held in place by a clamping ring 4, which in turn, is affixed to a top of the cathode body 10 via a plurality of screws 6 and 8, respectively. The electrode 1 also includes a sealing plate 12, which forms a seal between the cathode body 10 and the sealing plate 12 via an O-ring 14. The water chamber 16 is defined between the cathode body 10 and the sealing plate 12 and includes a magnetic assembly comprising a magnetic field shaping ring 18, a plurality of magnets 20 and 22, a base ring 24 and a central magnet 26 centered within the magnetic field shaping ring 18. The magnets 20, 22 and 26 are generally standard magnets that can produce a residual flux density of about 38 MGO (Mega Gause Orstead). The electrode 1 further includes a water inlet supply 28 and a water outlet 30 for allowing cooling water to flow through the water chamber 16. The electrode 1 also includes a ring-shaped anode shield 32 that is affixed to an anode shield support 34 via a plurality of screws 36 and 38, respectively. The anode shield support 34 is affixed to a base plate 40 via a plurality of screws 42 and 44. An insulating plate 46 is interposed between base plate 40 and sealing plate 12, wherein the insulating plate 46 electrically insulates the cathode body 10 and the sealing plate 12 from the base plate 40. A water-tight seal is maintained between the insulating plate 46 and the sealing plate 12 by an O-ring 48 interposed therebetween. A power cable 50, which is affixed to the sealing plate 12 via a screw 52, supplies electric current to the cathode body 10 over the interface of the cathode body 10 with sealing plate 12 in the vicinity of O-ring 14.

There are several problems that exist with respect to prior art sputtering devices. Because the sputtering process produces intense heat, the power rating of the sputtering device is limited primarily by the ability to cool the device by means of flowing water. Overheating of the device due to inefficient cooling will cause stress cracks to form in highly stressed target materials, such as ceramic and brittle metals, which can cause arcing and short outs. This heat buildup causes higher electrical resistance, which impedes the flow of electrons thereby yielding lower deposition rates than would otherwise have been possible if such heat were not present. Further, because the prior art anode shield 32 is above the target surface level, buildup of target material occurs on a surface of the anode shield 32, which has a tendency to flake off and fall back onto the target 2 thus causing a short out.

In semi-conductor manufacturing, electrical components, for example, resistors, transistors, and capacitors, are commonly mounted on circuit panel structures, such as printed circuit boards. Circuit panels ordinarily include a generally flat sheet of dielectric material with electrical conductors disposed on a major, flat surface of the sheet, or on both major surfaces. The conductors are commonly formed from metallic materials, such as copper and serve to interconnect the electrical components mounted to the board. Where the conductors are disposed on both major surfaces of the panel, the panel may have via conductors extending through holes (or through vias) and the dielectric layer so as to interconnect the conductor on opposite surfaces. These vias can be on the order of sub-atomic sizes. Presently, prior art electrodes, such as electrode 1 shown in FIG. 1, can typically provide continuous discharge at power levels of 250 watts/in$^2$ thus resulting in non-uniform coating C of a via V of a substrate S such as shown in FIG. 2.

Plasma density refers to the number of gaseous ions retained within the magnetic field. With an increase in plasma density, higher power such as in the range of 500-1000 watts/in$^2$ can be supplied allowing for higher deposition rates. However, the typical prior art sputtering electrode 1 operating in a range of 500-1,000 watts/in$^2$ can only be achieved through pulsing the electrode instead of a continuous discharge, or otherwise the electrode will quickly burn out. This pulsing of the electrode at power levels ranging from 500-1,000 watts/in$^2$ also results in a non-uniform coating C of the via V of the substrate S as shown in FIG. 2.

It has been shown that a continuous pulse discharge at power levels in the range of 500-1,000 watts/in$^2$ provide sputtering that is more orderly and straight resulting in a coating C of uniform thickness of a via V' of a substrate S' as shown in FIG. 7. Therefore, there is a need for a robust high power cathode (i.e., electrode) that has a more efficient cooling arrangement than that of the prior art electrode such that the cathode can provide continuous discharge at high power as opposed to a pulsing arrangement.

SUMMARY OF THE INVENTION

The present invention provides for a magnetron sputtering electrode for use within a magnetron sputtering device that includes a cathode body having an upper surface and a lower surface, a back plate secured to the upper surface of the cathode body, a target retainer engaged with the back plate, an insulator plate secured to the lower surface of the cathode body, a base plate secured to the insulator plate, wherein the back plate, the insulator plate and the cathode body define a magnet receiving chamber therein. A plurality of magnets are received within the magnet receiving chamber, wherein the magnets cooperate to generate magnetic flux lines which form a closed loop magnetic tunnel adjacent to a top surface of the target. The electrode further includes an anode shield secured to the base plate, wherein the anode shield surrounds and contains the cathode body, the back plate and the insulator plate. The anode shield also defines a plurality of recesses, and a side wall secured to the anode shield and covering the recesses, wherein the recesses define a passageway for allowing coolant to circulate therethrough.

BRIEF DESCRIPTION OF THE DRAWINGS

FIG. 3 is a perspective view of a magnetron sputtering electrode made in accordance with the present invention;

FIG. 4 is a top plan view of the sputtering electrode shown in FIG. 3;

FIG. 7 is an elevational view of a substrate having a via with a coating of uniform thickness deposited thereon using the magnetron sputtering electrode of the present invention.

DETAILED DESCRIPTION OF THE INVENTION

Figure 1:
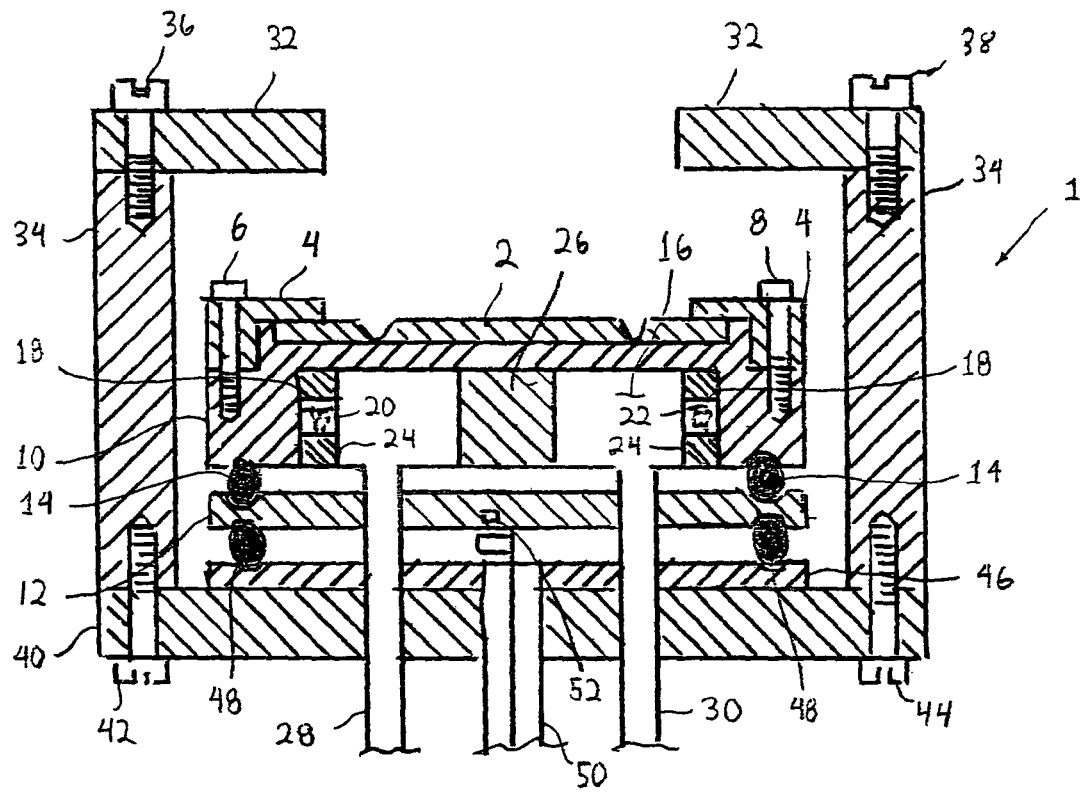
FIG. 1 is a sectional side view of a prior art magnetron sputtering electrode.
Figure 2:
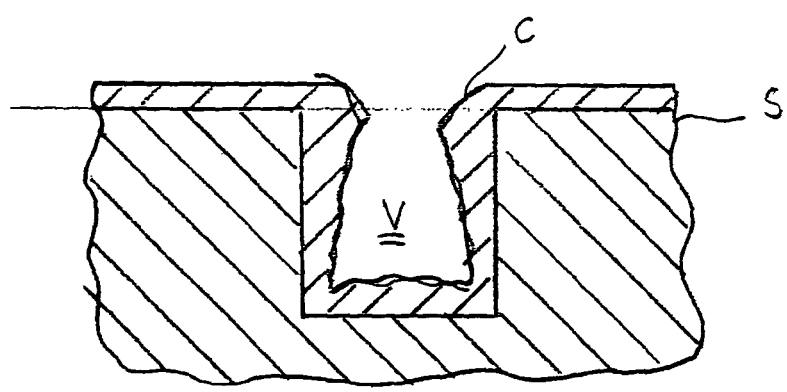
FIG. 2 is an elevational view of a substrate having a via with a coating of non-uniform thickness deposited thereon using a prior art magnetron sputtering electrode.
Figure 5:
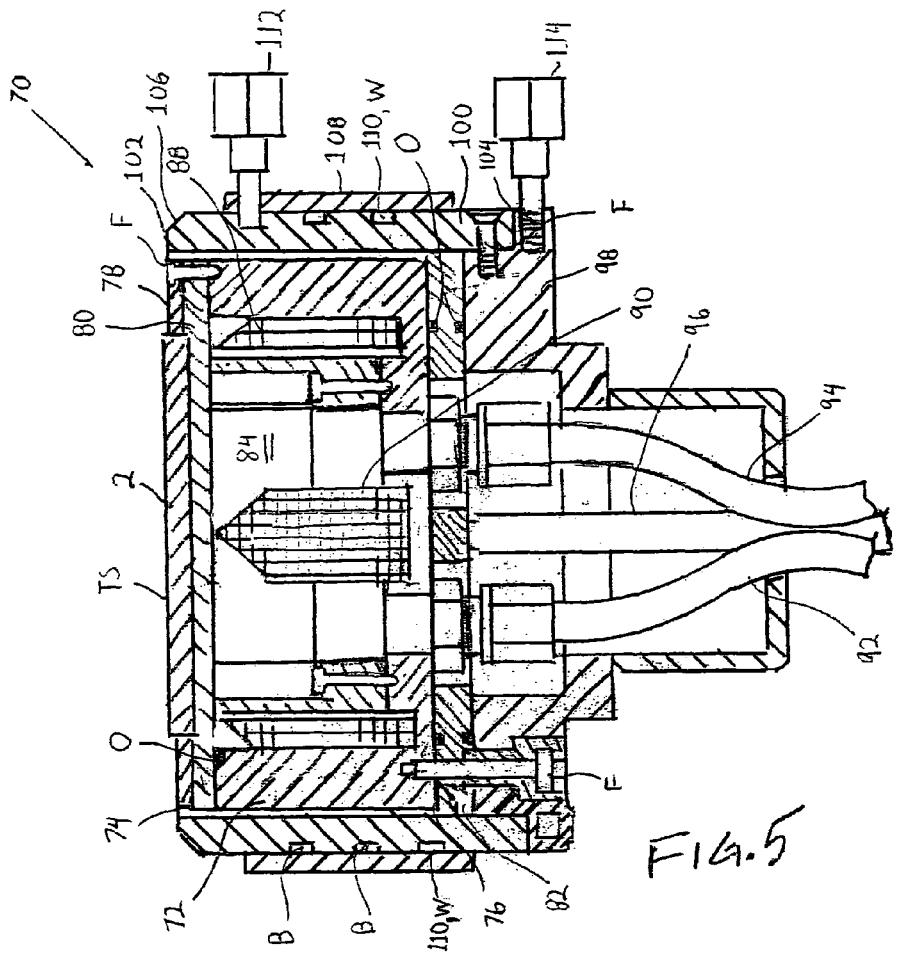
FIG. 5 is a sectional view of the sputtering electrode shown in FIG. 4 taken along lines V-V.
Figure 6:
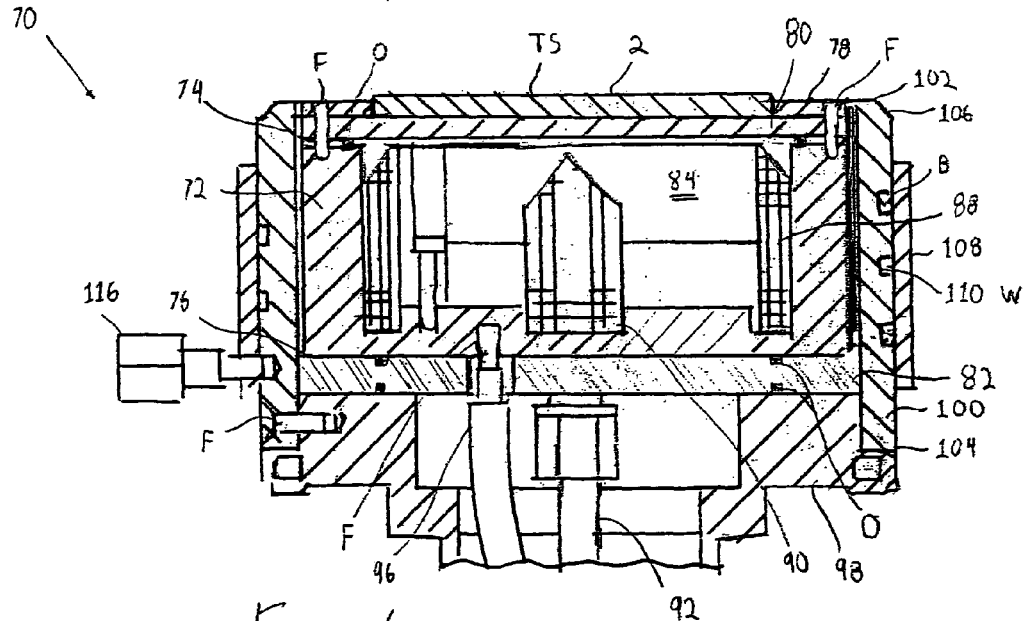
FIG. 6 is a sectional view of the sputtering electrode shown in FIG. 4 taken along lines VI-VI.

Referring to FIGS. 3-6, the present invention provides for a magnetron sputtering electrode 70 for use within a magnetron sputtering device that includes a target 2, a cathode body 72 having an upper surface 74 and a lower surface 76 and a ring-shaped anode shield 100 surrounding the cathode body 72. Target 2 is held in place by an annular or ring-shaped target clamping ring 78, which also functions as a cathode seal. The electrode 70 is preferably annular shaped, but may also be rectangular shaped in which the target 2, clamping ring 78 and anode shield 100 would be shaped to fit the shape and size of the electrode 70. The clamping ring 78 is affixed to the upper surface 74 of the cathode body 72 via a plurality of fasteners F about the circumference of the clamping ring 78. Interposed between the clamping ring 78 and the upper surface 74 of the cathode body 72 is a metallic back plate 80, wherein the target 2 is affixed to the back plate 80, and the back plate 80 is sealed to the cathode body 72 via a seal O such as an O-ring. The electrode 70 also includes an insulating plate 82 and a base plate 98, wherein the insulator plate 82 is sandwiched between the lower surface 76 of the cathode body 72 and the base plate 98 thus forming a water tight seal via a seal O interposed therebetween. The insulator plate 82 is preferably made of ceramic, such as alumina or MACOR®. These ceramic insulators are capable of withstanding the intense heat caused by the sputtering process without warping or cracking.

The cathode body 72 cooperates with the insulator plate 82 to form a coolant chamber or magnet receiving chamber 84, which is made water tight via a seal O interposed therebetween. Contained within the chamber 84 is a magnet assembly, which may include annular magnet 88 and a center magnet 90. This magnet assembly is similar to the magnet assembly described in U.S. Pat. Nos. 5,736,019 and 6,171,461, which are hereby incorporated by reference in their entirety. Coolant such as cooling water enters chamber 84 via an inlet supply 92 and exits the chamber 84 via an outlet 94. The magnets 88, 90 are preferably high energy magnets, such as, for example, rare earth magnets (Samarium Cobalt or Neodymium Iron Boride) that have an MGO for a low mass of magnetic material as compared to a standard grade magnet such as an Aluminum Nickel Cobalt magnet for the same mass. Preferably, the high energy magnets 88, 90 can produce a high residual flux density greater than 40 MGO, preferably in the range of 40 to 50 MGO.

Electric current is supplied to the cathode body 72 via a power cable 96, which is affixed directly to the cathode body 72 via a fastener F. The direct connection of the power cable 96 to the cathode body 72 provides for low resistivity and impedance, and eliminates the oxidation problem associated with the prior art electrode 1 in which the power connection is made to the sealing plate 12 and then to the cathode body 10.

The anode shield 100 having an upper end 102 and a lower end 104 surrounds the cathode body 72 and is affixed about its circumference to the base plate 98 via a plurality of fasteners F. The upper end 102 of the anode shield 100 is chamfered to form a contoured top portion 106. The contoured top portion 106 is shown angled on one side away from the target 2, wherein the apex of the top portion 106 is spaced from the target 2. The shape of the contoured top portion 106 may include, but not limited to sloped, conical, parabolic, convex, and concave shapes. Further, the apex of the top portion 106 of the anode shield 100 is shown slightly below a top surface TS of the target 2, but may also be positioned at the same level as the target surface TS. The position of the upper end 102 of the anode shield 100 at or below the target surface TS minimizes the buildup of target material on the anode shield 100, and the use of such contoured shapes allows for any buildup of the target material on the anode shield 100 to flake off in a direction away from the target surface TS thus preventing short outs.

Adjacent the anode shield 100 is a sidewall 108 secured to a portion of the anode shield 100 between the upper end 102 and the lower end 104. The anode shield 100 also defines a plurality of recesses 110, wherein the sidewall 108 covers the recesses 110 thereby defining a plurality of axially spaced, radially extending coolant passageways W as defined by a plurality of planar sections taken across the anode shield 100, the passageways W positioned between the anode shield 100 and the sidewall 108. See FIGS. 5 and 6. The passageways W, which are positioned about the cathode body 72, are spaced between the upper end 102 and the lower end 104 of the anode shield 100. Coolant enters the passageways W of the anode shield 100 via an anode inlet 112 and exits the passageways W via an anode outlet 114. A coolant coupling 116 (shown in FIGS. 3 and 6) allows coolant to flow in a direction from the upper end 102 to the lower end 104 of the anode shield 100, thereby cooling the anode shield 100 between the upper end 102 and the lower end 104 thereof. The passageways W generally have one or more diverters or baffles B (shown in FIGS. 5 and 6) in order to create greater turbulent flow characteristics when coolant circulates through the passageways W. These baffles can be ridges and bumps or any other arrangement positioned in the passageways W to mix the water, as it flows through the passageways W to improve cooling via conduction and convection. The turbulent flow of the coolant allows for more efficient cooling of the anode shield 100 in contrast to laminar flow. The coolant may be, for example, water, air or refrigerant.

The electrode 70, which can have a field strength on the order of one telsa, can provide continuous discharge at high power in the range of 500-1,000 watts/in$^2$ without burning out. This is due to the fact that electrode 70 has cooling both at the anode shield 100 and at the center of the cathode body 72. Because of the additional cooling, continuous discharge at higher powers can be achieved with the electrode 70 thus permitting higher deposition rates resulting in a more uniform coating C' of a via V' of a substrate S' as shown in FIG. 7.

While specific embodiments of the invention have been described in detail, it will be appreciated by those skilled in the art that various modifications and alternatives to those details could be developed in light of the overall teachings of the disclosure. The presently preferred embodiments described herein are meant to be illustrative only and not limiting as to the scope of the invention which is to be given the full breadth of the appended claims and any and all equivalents thereof.

The invention claimed is:

1. A magnetron sputtering electrode for use within a magnetron sputtering device, the magnetron sputtering electrode comprising:
a cathode body;
a target receiving area defined adjacent the cathode body;
a plurality of magnets received within a magnet receiving chamber; and
an anode shield having an upper end and a lower end surrounding the cathode body, the anode shield defining a plurality of axially spaced, radially extending coolant passageways as defined by a plurality of planar sections taken across the anode shield, the passageways positioned about the cathode body and spaced between the upper end and the lower end of the anode shield, whereby the coolant passageways are adapted to receive coolant to circulate therethrough thereby cooling the anode shield between the upper end and the lower end thereof;
wherein the plurality of magnets are high energy rare earth magnets that can produce a flux density of at least 40 MGO.

2. The magnetron sputtering electrode as claimed in claim 1, wherein the plurality of magnets cooperate to generate magnetic flux lines which form a closed loop magnetic tunnel adjacent to a top surface of the target.

3. The magnetron sputtering electrode as claimed in claim 1, further comprising a target received by the target receiving area.

4. The magnetron sputtering electrode as claimed in claim 1, further comprising a power supply coupled directly to the cathode body.

5. The magnetron sputtering electrode as claimed in claim 3, wherein the cathode body has an upper surface and a lower surface, the electrode further comprising:
a back plate secured to the upper surface of cathode body;
an insulator plate secured to the lower surface of the cathode body;
a base plate secured to the insulator plate, wherein the back plate, the insulator plate and the cathode body defining the magnet receiving chamber thereby forming a water tight seal.

6. The magnetron sputtering electrode as claimed in claim 5, further comprising a target retainer for securing the target to the back plate, wherein the back plate is positioned between the target and the upper surface of the cathode body, the target retainer and back plate affixed to the cathode body.

7. The magnetron sputtering electrode as claimed in claim 3, wherein the upper end of the anode shield comprises a contoured top portion.

8. The magnetron sputtering electrode as claimed in claim 7, wherein the contoured top portion of the anode shield is angled on one side away from the target.

9. The magnetron sputtering electrode as claimed in claim 7, wherein the upper end of the anode shield is positioned below the target.

10. The magnetron sputtering electrode as claimed in claim 1, wherein a plurality of recesses are defined in the anode shield and a side wall is secured to the anode shield and covers the recesses, wherein the recesses define the coolant passageways.

11. The magnetron sputtering electrode as claimed in claim 1, further comprising coolant received in the coolant passageways, wherein the coolant circulates through the coolant passageways thereby cooling the anode shield between the upper end and the lower end thereof.

12. The magnetron sputtering electrode as claimed in claim 11, further comprising coolant received in the magnet receiving chamber, wherein the coolant circulates through the magnet receiving chamber thereby cooling the cathode body.

13. The magnetron sputtering electrode as claimed in claim 12, wherein the coolant circulating through the coolant passageways of the anode shield and the coolant circulating through the magnet receiving chamber are the same.

14. The magnetron sputtering electrode as claimed in claim 12, wherein the coolant circulating through the coolant passageways of the anode shield and the coolant circulating through the magnet receiving chamber are different.

15. The magnetron sputtering electrode as claimed in claim 12, wherein the coolant comprises water, air or refrigerant.

16. The magnetron sputtering electrode as claimed in claim 1, wherein the electrode is one of a rectangular shaped or cylindrical shaped.

17. The magnetron sputtering electrode as claimed in claim 5, wherein the insulator plate is made of a ceramic material.

18. The magnetron sputtering electrode as claimed in claim 1, wherein one or more diverters are defined within the coolant passageways in order to create greater turbulent flow characteristics.

19. A magnetron sputtering electrode for use within a magnetron sputtering device, the magnetron sputtering electrode comprising:
a cathode body having an upper surface and a lower surface;
a back plate secured to the upper surface of the cathode body;
a target receiving area defined adjacent the back plate;
an insulator plate secured to the lower surface of the cathode body;
a base plate secured to the insulator plate, wherein the back plate, the insulator plate and the cathode body define a magnet receiving chamber therein;
a plurality of magnets received within the magnet receiving chamber, wherein the magnets cooperate to generate magnetic flux lines which form a closed loop magnetic tunnel adjacent to the target receiving area;
an anode shield having an upper end and a lower end surrounding the cathode body, the back plate and the insulator plate, wherein the anode shield defining a plurality of recesses is secured to the base plate; and
a side wall secured to the anode shield and covering the recesses, wherein the recesses define a plurality of axially spaced, radially extending coolant passageways as defined by a plurality of planar sections taken across the anode shield, the passageways positioned about the cathode body and spaced between the upper end and the lower end of the anode shield, the coolant passageways adapted to receive coolant to circulate therethrough thereby cooling the anode shield between the upper end and the lower end thereof;

wherein the plurality of magnets are high energy rare earth magnets that can produce a flux density of at least 40 MGO.

20. A method of providing a continuous high power discharge in sputtering applications, the method comprising:
   providing a substrate;
   providing a cathode body;
   providing a target received by the cathode body;
   providing an anode shield having an upper end and a lower end surrounding the cathode body;
   providing a closed loop magnet arrangement within a magnet receiving chamber, the closed loop magnet arrangement comprised of a plurality of magnets, wherein the magnets cooperate to generate magnetic flux lines which form a closed loop magnetic tunnel adjacent to a top surface of the target;
   cooling the anode shield between the upper end and the lower end thereof, wherein a plurality of axially spaced, radially extending coolant passageways as defined by a plurality of planar sections taken across the anode shield, the passageways are defined in the anode shield such that the passageways are positioned about the cathode body and spaced between the upper end and the lower end of the anode shield; and
   depositing the target material onto the substrate;
   wherein the plurality of magnets are high energy rare earth magnets that can produce a flux density of at least 40 MGO.

21. The magnetron sputtering electrode as claimed in claim 1, wherein the electrode provides continuous discharge at high power in the range of 500-1,000 watts/in$^2$.

22. The magnetron sputtering electrode as claimed in claim 1, wherein the high energy magnets can produce a flux density of 40-50 MGO.

23. The magnetron sputtering electrode as claimed in claim 1, wherein the high energy magnets comprise Neodynium Iron Boride.

* * * * *

UNITED STATES PATENT AND TRADEMARK OFFICE
CERTIFICATE OF CORRECTION

PATENT NO. : 8,470,141 B1  
APPLICATION NO. : 11/411427  
DATED : June 25, 2013  
INVENTOR(S) : Mark A. Bernick Page 1 of 1

It is certified that error appears in the above-identified patent and that said Letters Patent is hereby corrected as shown below:

Title Page of the Patent, Column 1, Item (73) Assignee, Line 1, delete "Dusquesne" and insert -- Duquesne --

In the Claims

Column 8, Line 17, Claim 23, delete "Neodynium" and insert -- Neodymium --

Signed and Sealed this
Nineteenth Day of November, 2013

Teresa Stanek Rea
*Deputy Director of the United States Patent and Trademark Office*